United States Patent [19]

Heim et al.

[11] 4,342,632

[45] Aug. 3, 1982

[54] METHOD OF METALLIZING A CERAMIC SUBSTRATE

[75] Inventors: Werner F. Heim, Swampscott; Hunter L. McDowell, Concord, both of Mass.

[73] Assignee: The United States of America as represented by the Secretary of the Army, Washington, D.C.

[21] Appl. No.: 259,873

[22] Filed: May 1, 1981

[51] Int. Cl.$^3$ .............................................. C23C 15/00
[52] U.S. Cl. ....................... 204/192 EC; 204/192 C; 204/38 R
[58] Field of Search ........... 204/192 EC, 192 C, 38 R

[56] References Cited

U.S. PATENT DOCUMENTS

| | | | |
|---|---|---|---|
| 4,011,143 | 3/1977 | Del Monte | 204/192 C |
| 4,140,592 | 2/1979 | Orlando | 204/192 C |
| 4,219,199 | 8/1980 | OKuda | 204/192 EC |
| 4,221,845 | 9/1980 | Koehler | 204/192 C |

OTHER PUBLICATIONS

R. Wechsung et al., Thin Solid Films 40, No. 1-3, Jan. 1977, pp. 393-394.

*Primary Examiner*—Veronica O'Keefe
*Attorney, Agent, or Firm*—Nathan Edelberg; Jeremiah G. Murray; Roy E. Gordon

[57] ABSTRACT

A ceramic substrate is metallized by a method including the steps of:
- (A) chemically cleaning the substrate,
- (B) sputter etching the chemically cleaned substrate,
- (C) sputtering a chromium layer of about 200 angstroms in thickness onto the substrate,
- (D) sputtering a molybdenum layer of about 3500 angstroms in thickness onto the chromium layer,
- (E) sputtering a copper layer of about 25,000 angstroms in thickness onto the molybdenum layer,
- (F) firing the coated substrate in dry hydrogen at about 1000° C. for about 10 minutes,
- (G) plating a copper-silver brazing alloy of about 0.0003 inch in thickness onto the copper layer, and
- (H) firing in dry hydrogen at about 700° C. for about 10 minutes.

6 Claims, No Drawings

METHOD OF METALLIZING A CERAMIC SUBSTRATE

The government has rights in this invention pursuant to Contract No. DAAB05-72-C-5859 awarded by Department of the Army.

This invention relates in general to a method of metallizing a ceramic substrate and in particular to a method of metallizing a beryllia substrate in such a manner as to provide a metallized substrate ready for brazing to metal parts without the use of brazing shims.

BACKGROUND OF THE INVENTION

The conventional molybdenum-manganese metallized bond has been used for years in the metallization of ceramics in the tube industry. The bonds are strong, but have a variable thermal impedance which depends on the thickness of the glassey phase between metal and ceramic. Their RF loss is also too high.

Two component sputtered metallized bonds, as for example, chromium followed by copper and molybdenum followed by copper have also been used to metallize ceramics. Brazing shims have then been used to subsequently brace the metallized parts to a metal surface.

Another technique of metallizing ceramics has involved sputtering a chromium layer followed by a molybdenum layer. A copper layer was then added by evaporation, the copper serving as a brazing alloy for brazing to molybdenum parts.

SUMMARY OF THE INVENTION

The general object of this invention is to provide a method of metallizing a ceramic substrate. A further object of the invention is to provide such a method wherein the resulting metallized substrate will be ready for brazing to metal parts without the use of brazing shims. A particular object of this invention is to provide a method of metallizing a beryllia substrate so that the metallized beryllia substrate will be ready for brazing to metal parts without the use of brazing shims.

It has now been found that the foregoing objects can be attained and a ceramic substrate metallized by a method including the steps of
(A) chemically cleaning the substrate,
(B) sputter etching the chemically cleaned substrate,
(C) sputtering a chromium layer of about 200 angstroms in thickness onto the substrate,
(D) sputtering a molybdenum layer of about 3500 angstroms in thickness onto the chromium layer,
(E) sputtering a copper layer of about 25,000 angstroms in thickness onto the molybdenum layer,
(F) firing the coated substrate in dry hydrogen at about 1000° C.,
(G) plating a copper-silver brazing alloy of about 0.0003 inch in thickness onto the copper layer, and
(H) firing in dry hydrogen at about 700° C. for about 10 minutes.

The method of the invention provides a metallized ceramic substrate ready for brazing to metal parts without the use of brazing shims. The technique results in a joint having lower R.F. loss and lower thermal resistance than is obtained with conventional molybdenum-manganese metalized joints. Moreover, the elimination of brazing shims as are required when a molybdenum-manganese joint is employed simplifies the procedure of making the brazed joints. The technique of this invention is believed to result in joints which are stronger than the two component sputtered metalized bonds described heretofore. It is further believed that the use of a sputtered layer of copper results in lower RF loss than does an evaporated layer of copper which has previously been added on top of a two component sputter metalized bond. The two component or two component plus evaporated copper systems may be directly brazed to molybdenum without brazing shims using the final copper layer as the brazing material. For brazes to copper, brazing shims must be employed. The addition of a layer of plated brazing alloy makes possible brazes to copper without the addition of brazing shims.

The two hydrogen firings are required to insure that the plated brazing alloy makes a satisfactory bond to the copper layer.

Both sides of the ceramic substrate are metallized in the same manner.

DESCRIPTION OF THE PREFERRED EMBODIMENT

A standard size 99% pure beryllia ceramic substrate having a dimension of $\frac{3}{4}$ inch $\times \frac{3}{4}$ inch $\times 0.050$ inch is lapped on both sides to a finish of 5 microinches and a thickness of $0.030 \pm 0.0001$ inch. The substrate is then chemically cleaned with a detergent wash, water rinse and alcohol rinse. The substrate is then sputter etched to remove any remaining contaminant. Chromium is then RF sputtered onto the substrate to a thickness of 200 angstroms. Molybdenum is then RF sputtered onto the chromium to a thickness of 3500 angstroms. Copper is then sputtered onto the molybdenum to a thickness of 25,000 angstroms. The metallized substrate is then fired in dry hydrogen at about 1000° C. for about 10 minutes, plated with an 0.0003 inch thick copper-silver brazing alloy, and fired in dry hydrogen at about 700° C. for about 10 minutes.

The chromium layer in the method serves to establish a bond to the substrate. In this regard, the metallizing method of the invention is related to that used for many types of printed circuit metallizing in which the initial chromium bonding layer is employed. The molybdenum layer serves as a barrier to prevent alloying of the chromium and copper layers at the brazing temperature. In conventional printed circuit metallizing, such a barrier layer is absent and as a result the metallizing loses adherence because of the alloying of the chromium bonding layer and a subsequent gold or copper layer at temperatures above about 600° C. Since brazes are to be made at a temperature exceeding 800° C., it is necessary that the molybdenum barrier layer be introduced to prevent this alloying. The use of the molybdenum barrier layer leads to a thin film metallizing which will withstand a temperature of 1000° C. The final and relatively thick copper layer is that in which the RF currents will flow. The chromium and molybdenum layers are relatively thin compared to an RF skin depth. The molybdenum layer is about 20% of a skin depth thick at 6 GHz. The copper layer, on the other hand is about $2\frac{1}{2}$ skin depths thick at 6 GHz, so that the RF currents will have decayed to a small value by the time they have reached the side of the copper layer away from the ceramic. It has been estimated that the RF attenuation of this metallizing should be about 20% higher than that of an ideal, perfectly smooth, copper interface.

Following the sputtering, copper-silver eutectic brazing alloy is applied to both sides of the substrate by electroplating. The plating bath is chosen and adjusted so that the copper and silver are deposited in the eutectic ratio simultaneously. The hydrogen firing step prior to plating has been found necessary to obtain a good quality plating without subsequent blistering. The reason for this is not clearly understood. It has been speculated that the hydrogen firing may be eliminating gases entrapped in the metallizing during the prior sputtering procedure.

The use of the metallizing method of the invention leads to a reduction of delay line attenuation to between 50 to 60 percent of that obtained with molybdenum-manganese metallizing technology. The metallizing method also results in a line with lower thermal resistance and hence a higher heat dissipation capability.

The method of the invention can also be applied to metallizing composite ceramics as for example, composite silicon-carbide and beryllia ceramic which are used as microwave absorbers. That is, substrates of the composite material may be hot pressed with the specified percentage of silicon-carbide. These materials may be sputter metallized and plated with copper-silver eutectic in the same manner as is employed for the beryllia substrates. The sputter metallizing has turned out to be a very effective way of metallizing these composite ceramics which cannot easily be metallized by conventional molybdenum-manganese processes. The difficulty with such conventional metallizing is that the silicon-carbide begins to decompose in the wet hydrogen atmosphere at the 1400°–1500° C. temperature which is commonly used to apply the metallizing. In the past, the composite materials containing silicon-carbide have, therefore, been metallized in a dry hydrogen atmosphere. This has produced metallizing of variable quality and adhesion. The use of the sputtered metallizing technology appears to be a means by which these composite ceramics may reliably be metallized.

We wish it to be understood that we do not desire to be limited to the exact details of the method as described for obvious modifications will occur to a person skilled in the art.

What is claimed is:

1. Method of metallizing a ceramic substrate to provide a metallized substrate ready for brazing to metal parts without the use of brazing shims said method including the steps of:
    (A) chemically cleaning the substrate,
    (B) sputter etching the chemically cleaned substrate,
    (C) sputtering a chromium layer of about 200 angstroms in thickness onto the substrate,
    (D) sputtering a molybdenum layer of about 3500 angstroms in thickness onto the chromium layer,
    (E) sputtering a copper layer of about 25,000 angstroms in thickness onto the molybdenum layer,
    (F) firing the coated substrate in dry hydrogen at about 1000° C. for about 10 minutes,
    (G) plating a copper-silver brazing alloy of about 0.0003 inch in thickness onto the copper layer, and
    (H) firing in dry hydrogen at about 700° C. for about 10 minutes.

2. Method according to claim 1 wherein both sides of the ceramic substrate are metallized in the same manner.

3. Method according to claim 2 wherein the ceramic substrate is beryllia.

4. Method according to claim 2 wherein the ceramic substrate is composite silicon-carbide and beryllia.

5. Method according to claim 1 wherein in step (G), copper and silver are deposited in the eutectic ratio simultaneously.

6. Method of metallizing both sides of a beryllia substrate to provide a metallized substrate ready for brazing to metal parts without the use of brazing shims, said method consisting of lapping a standard size 99% pure beryllia ceramic substrate having a dimension of $\frac{3}{4}$ inch×$\frac{3}{4}$ inch×0.050 inch on both sides to a finish of 5 microinches and a thickness of 0.030±0.0001 inch, chemically cleaning the substrate with a detergent wash, water rinse, and alcohol rinse, sputter etching the substrate to remove any remaining contaminant, RF sputtering chromium onto the substrate to a thickness of 200 angstroms, RF sputtering molybdenum onto the chromium to a thickness of about 3500 angstroms, sputtering copper onto the molybdenum to a thickness of about 25,000 angstroms, firing the metallized substrate in dry hydrogen at about 1000° C. for about 10 minutes, plating with an 0.0003 inch thick copper-silver brazing alloy wherein copper and silver are deposited in the eutectic ratio simultaneously, and firing in dry hydrogen at about 700° C. for about 10 minutes.

* * * * *